United States Patent
Morii et al.

[11] Patent Number: 6,166,912
[45] Date of Patent: Dec. 26, 2000

[54] IC CARD AND MANUFACTURING METHOD THEREOF

[75] Inventors: Tomomi Morii; Kiyotaka Nishino; Shigeo Onoda, all of Tokyo, Japan

[73] Assignees: Mitsubishi Denki Kabushiki Kaisha; Mitsubishi Electric Engineering Industrial Co., Ltd., both of Tokyo, Japan

[21] Appl. No.: 09/081,677

[22] Filed: May 20, 1998

[30] Foreign Application Priority Data

Nov. 21, 1997 [JP] Japan ................................. 9-321007

[51] Int. Cl.⁷ ........................................ H05K 7/14
[52] U.S. Cl. .................... 361/737; 361/801; 156/306.3
[58] Field of Search .................................. 361/724, 736, 361/737, 752, 800, 801; 235/492; 220/4.02; 439/946; 264/449; 156/306.3

[56] References Cited

U.S. PATENT DOCUMENTS

| | | | |
|---|---|---|---|
| 5,394,298 | 2/1995 | Sagisaka | 361/704 |
| 5,453,975 | 9/1995 | Ohta et al. | 369/275.1 |
| 5,597,428 | 1/1997 | Matsumoto et al. | 159/69 |
| 5,968,442 | 10/1999 | Sato et al. | 264/449 |

FOREIGN PATENT DOCUMENTS 7-160837  6/1995  Japan .
9-58164   3/1997  Japan .

*Primary Examiner*—Jayprakash N. Gandhi
*Attorney, Agent, or Firm*—McDermott, Will & Emery

[57] ABSTRACT

There is provided an IC card and manufacturing method thereof assuring a highly reliable fixed portion in fixing upper and lower panel members to a frame made of resin as well as an advantage in terms of manufacturing cost. In the IC card in which a pair of upper and lower panel members covering card planar portions are respectively fixed to the upper and the lower surfaces of a resin frame which supports a peripheral portion of an electric circuit board and a connector attached to an end portion of the electric circuit board, the panel members have their peripheral edge portions which are provided with a bent portion extending along the peripherial edge portions and are formed by bending the panel material at a specified angle, and a welding use resin layer is formed on the surface of the bent portion and the periphery of the planar portion of the panel member. On the other hand, the frame is provided with a groove portion for receiving therein the bent portion, and the welding use resin layer is melted in a pressurized state while making the welding use resin layer abut against the frame with the bent portion fitted in to the groove portion, thereby fixing the panel members to the frame.

12 Claims, 9 Drawing Sheets

IC CARD AND MANUFACTURING METHOD THEREOF

BACKGROUND OF THE INVENTION

The present invention relates to an IC card and manufacturing method thereof.

Conventionally, for so-called IC cards have been generally and widely employed, a structure in which internal components such as electric circuit boards having specific electronic parts and the like incorporated therein are disposed in a resin frame and planar portions of the card are covered by a pair of metal panels.

It is to be noted in the present specification that the term "IC card" means a card-shaped or flat-plate-shaped object provided with an electric circuits or electronic circuits including semiconductor circuits, and it is defined that cards called by a variety of different names of PC card, modem card, LAN card, memory card, electronic card and so on having a similar basic arrangement are included in this category.

As a structure of such an IC card, and in particular, as a structure for fastening a metal panel to the frame, a variety of structures are known. For example, the document of Japanese Patent Laid-Open Publication No. HEI 9-58164 (referred to as a first prior art hereinafter) discloses an IC card in which a metal panel can be fastened to a main body frame by forming a plurality of bent portions at a peripheral edge portion of a metal panel to be fastened to the front and rear surfaces of the main body resin frame, forming a hole portion at the bent portions, inserting the bent portions into groove portions provided at the main body resin frame and implanting the bent portions while melting the resin of the frame by supersonic welding.

On the other hand, the document of Japanese Patent Laid-Open Publication No. HEI 7-160837 (referred to as a second prior art hereinafter) discloses an IC card in which an elastic tongue-like projection formed at a peripheral edge portion of a metal panel can be press-fit into a groove provided on the frame for the fastening of one metal panel to the frame, thereby achieving an engagement. This IC card employs a frame which is preparatorily integrated with a metal panel on one side of the frame.

As another structure of the IC card for press-fitting and fastening a metal panel to a frame, there is a known one in which upper and lower metal panels are fastened to an integrated frame by means of a projection formed at a peripheral edge portion of the metal panels (referred to as a third prior art hereinafter).

Figure 18:
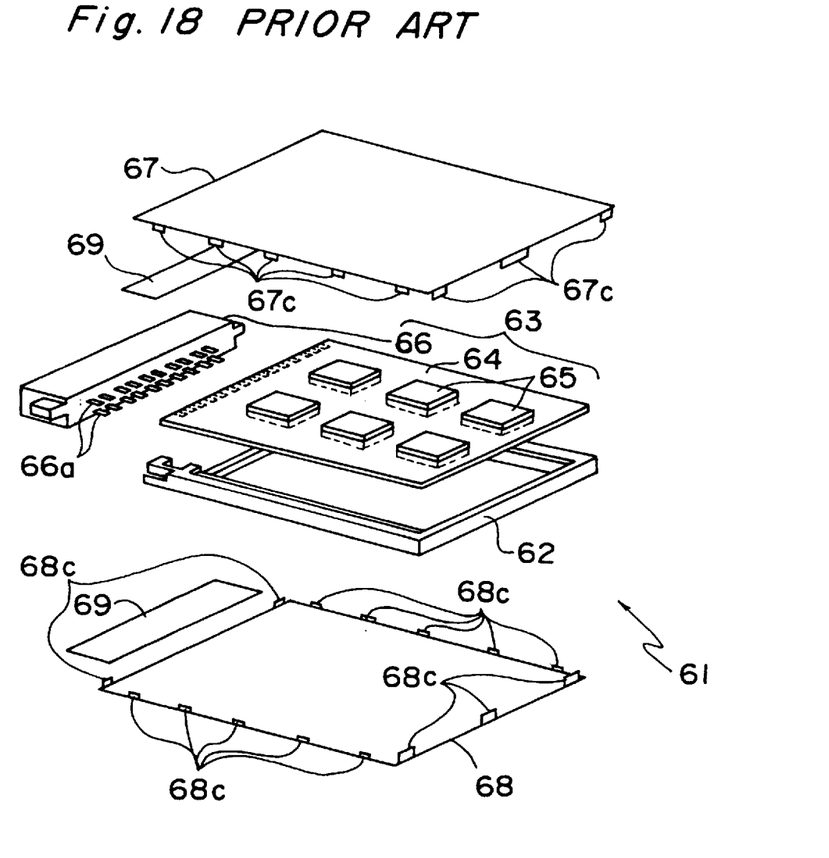
FIG. 18 is an exploded perspective view of an IC card according to a prior art.

FIG. 18 is an exploded perspective view of an IC card 61 according to this third prior art. This IC card 61 is provided with an electric circuit board 64 incorporated with specified electronic components 65, a frame 62 which is made of resin and supports a connector 66 attached to one end side of the electric circuit board 64 and a pair of upper and lower metal panels 67 and 68 for covering a planar portion of the card on the upper surface side and the lower surface side. The connector 66 is for obtaining an electrical connection of the present IC card with a device (for example, a personal computer or the like) in which the card is used.

Side edge portions (except for the portion for attaching the connector 66) of the metal panels 67 and 68 are provided with a plurality of projections 67c and 68c obtained by bending the panel material at an angle of approximately 90 degrees, while the frame 62 is provided with a plurality of slits for allowing the lugs 67c to be received in portions corresponding to the lugs 67c and 68c on the upper surface side and the lower surface side.

Figure 19:
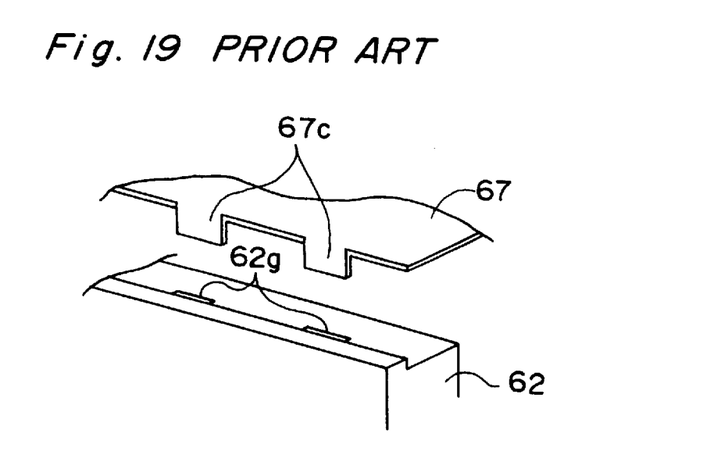
FIG. 19 is an enlarged perspective view showing side portions of an upper surface portion of a frame and the upper panel of the IC card according to the above prior art.

FIG. 19 is a perspective view of a side portion of the frame 62 in a state before the lugs 67c of the metal panel 67 are press-fit into the slit 62g on the upper surface of the frame 62. The length of the slit 62g is set shorter than the length of the lug 67c by a specified length (for example, 0.15 mm). By forcibly press-fitting each lug 67c into the corresponding slit 62g with an external force applied, each lug 67c is press-fit in and fixed to the frame 62 with a specified fitting force. In FIG. 18, the metal panel 68 covering the reverse side of the IC card 61 is also press-fit in and fixed to the frame 62 similar to the metal panel 67 on the upper surface side.

In this IC card 61, the connector 66 attached to one end side of the frame 62 and the metal panels 67 and 68 are connected to each other by means of an adhesive sheet 69.

Further, as a means for fixing the metal panels to the frame by means of an adhesive sheet, there is a known practice of using an adhesive sheet which is formed into a frame-like shape in correspondence with the planar shape of the frame and bonding the upper and lower metal panels, the frame and connector together by means of the sheet covering approximately the entire area of the contact surfaces of them (referred to as a fourth prior art hereinafter).

However, the aforementioned prior arts have had the respective problems as follows.

That is, in the case of the aforementioned first prior art, the metal panels are welded by a supersonic wave to the frame made of resin, whereas they are welded together only at the bent portions formed at the peripheral edge portion. Therefore, it is hard to stably obtain a sufficient fixing force capable of enduring a long-term use.

On the other hand, in the case of the aforementioned second prior art, the metal panels are fixed to the frame only by the engagement of the elastic projections formed at their peripheral edge portions engaged with the grooves provided on the frame. Therefore, it is still generally hard to stably obtain a sufficient fixing force capable of enduring a long-term use.

In the case of the aforementioned third prior art, the press-fitting force effects only the lengthwise end portions of the projections 67c and 68c of the metal panels 67 and 68 and the lengthwise end portions of the slits 62g of the frame 62. Therefore, the press-fitting power is relatively weak, and it is still hard to stably obtain a sufficient fixing force capable of enduring a long-term use.

In the case of the aforementioned fourth prior art, the adhesive sheet is required to be formed into the frame-like shape corresponding to the planar shape of the frame. Therefore, the adhesive sheet itself costs much and a workability in the adhering process becomes worse, consequently leading to a disadvantage in terms of manufacturing cost.

SUMMARY OF THE INVENTION

The present invention has been developed in view of the aforementioned problems, and its object is to provide an IC card and manufacturing method thereof assuring a highly reliable fixed portion in fixing upper and lower panel members to a frame made of resin as well as an advantage in terms of manufacturing cost.

Accordingly, in a first aspect of the present invention, there is provided an IC card in which a pair of upper and lower panel members covering card planar portions are respectively fixed to an upper and a lower surfaces of a resin frame which supports a peripheral portion of an electric circuit board and a connector attached to an end portion of the electric circuit board, wherein a welding use projecting portion is formed on a frame surface which faces to the panel member, a welding use resin layer is formed on the panel member at least in a portion thereof which corresponds to said welding use projecting portion, and said welding use resin layer and said welding use projecting portion are melted in a pressurized state, thereby fixing said panel member to said frame.

According to the first aspect of the present invention, the welding use resin layer formed on the planar portion periphery of each panel member and the welding use projecting portion provided on the frame are melted together, so that the metal panel is welded to the frame. Therefore, a sufficient fixing force capable of enduring a long-term use can be stably obtained.

Also, in the above mentioned aspect of the present invention, it is prefered that said panel member has a surface properties of which the surface roughness is not less than a specified roughness in a portion in which said welding use resin layer is formed.

In this case, basically the same effects as in the above mentioned aspect of the present invention can be achieved. Moreover, the panel member is set to have a surface properties of which the surface roughness is not less than a specified roughness in a portion in which said welding use resin layer is formed, thereby allowing the welding use resin layer to have an improved adhesion to the panel member.

Further, in the above mentioned aspects of the present invention, it is prefered that the welding use resin layer is formed on the panel member in a portion thereof which corresponds to at least a part of said connector.

In this case, basically the same effects as in the above mentioned aspects of the present invention can be achieved. Moreover, the panel member and the connector are welded together by melting the welding use resin layer formed in correspondence with at least a part of the connector. This arrangement can obviate the need for an adhesive sheet, thereby allowing the components to be handled in the assembling process to be reduced in number. The welding use resin layer formed in correspondence with the connector can be melted, for example, by applying a supersonic wave while pressurizing the panel members from above and below with the resin layer corresponding to the connector made to abut against the connector.

Furthermore, in the above mentioned aspects of the present invention, it is prefered that said welding use resin layer and said welding use projecting portion which abut against each other are melted by applying a supersonic wave or vibration to said panel member.

In this case, basically the same effects as in the above mentioned aspects of the present invention can be achieved. Moreover, the pressurizing process for pressurizing the panel members from above and below is performed with a supersonic wave or vibration applied to the panels. This arrangement can obviate the need for holding the panel member and the frame in a state in which they are combined with each other and allow the welding use resin layer formed on the panel member or the welding use projecting portion provided on the frame to be melted and softened in a very short time in comparison with the case where they are pressurized while being held with heat applied by, for example, a thermostatic oven, thereby allowing the productivity of the card assembling process to be improved.

Furthermore, in the above mentioned aspects of the present invention, it is prefered that said panel member is integrally fixed on the upper surface or the lower surface of said resin frame in forming said frame.

In this case, basically the same effects as in the above mentioned aspects of the present invention can be achieved. Moreover, one panel member and the frame are integrated with each other by, for example, the so-called panel-frame integrating method in forming the frame made of resin, thereby improving the rigidity of the frame and eliminating the concern about the occurrence of deformation of the frame or the like due to the pressure force applied when welding the other panel member.

Furthermore, in a second aspect of the present invention, there is provided an IC card in which a pair of upper and lower panel members covering card planar portions are respectively fixed to an upper and a lower surfaces of a resin frame which supports a peripheral portion of an electric circuit board and a connector attached to an end portion of the electric circuit board, wherein said panel member has its peripheral edge portion provided with a bent portion which is extended along the peripheral edge portion by bending a panel material at a specified angle, a welding use resin layer is formed on a surface of the bent portion and a periphery of a planar portion of the panel member, and said frame is provided with a groove portion for receiving therein said bent portion, whereby said welding use resin layer is melted in a pressurized state while making said welding use resin layer abut against the frame with said bent portion fitted into the groove portion, thereby fixing said panel member to said frame.

According to the second aspect of the present invention, the welding use resin layer formed on the planar portion periphery of each panel member and the welding use resin layer formed on the bent portion are melted together, so that the panel member is welded to the frame. Therefore, a sufficient fixing force capable of enduring a long-term use can be stably obtained.

Furthermore, in the above mentioned aspect of the present invention, it is prefered that a thickness of said bent portion including the welding use resin layer formed on its surface is greater by a specified thickness than a width of the groove portion of said frame.

In this case, basically the same effects as in the above mentioned aspect of the present invention can be achieved. Moreover, the thickness of the bent portion of the panel member including the welding use resin layer formed on the surface is set greater than the width of the groove portion of the frame. Therefore, the reliability of the welded and fixed portions of the resin layer on the bent portion and the groove portion can be improved.

Furthermore, in the above mentioned aspects of the present invention, it is prefered that the welding use resin layer is formed on the panel member in a portion thereof which corresponds to at least a part of said connector.

In this case, basically the same effects as in the above mentioned aspects of the present invention can be achieved. Moreover, the panel member and the connector are welded together by melting the welding use resin layer formed in correspondence with at least a part of the connector. This arrangement can obviate the need for an adhesive sheet, thereby allowing the components to be handled in the assembling process to be reduced in number. The welding use resin layer formed in correspondence with the connector can be melted, for example, by applying a supersonic wave while pressurizing the panel members from above and below with the resin layer corresponding to the connector made to abut against the connector.

Furthermore, in the above mentioned aspects of the present invention, it is prefered that said panel member has a surface properties of which the surface roughness is not less than a specified roughness in a portion in which said welding use resin layer is formed.

In this case, basically the same effects as in the above mentioned aspects of the present invention can be achieved. Moreover, the panel member is set to have a surface properties of which the surface roughness is not less than a specified roughness in a portion in which said welding use resin layer is formed, thereby allowing the welding use resin layer to have an improved adhesion to the panel member.

Furthermore, in the above mentioned aspects of the present invention, it is prefered that said welding use resin layer is melted by applying a supersonic wave or vibration to said panel member.

In this case, basically the same effects as in the above mentioned aspects of the present invention can be achieved. Moreover, the pressurizing process for pressurizing the panel members from above and below is performed with a supersonic wave or vibration applied to the panels. This arrangement can obviate the need for holding the panel member and the frame in a state in which they are combined with each other and allow the welding use resin layer formed on the panel member or the welding use projecting portion provided on the frame to be melted and softened in a very short time in comparison with the case where they are pressurized while being held with heat applied by, for example, a thermostatic oven, thereby allowing the productivity of the card assembling process to be improved.

Furthermore, in the above mentioned aspects of the present invention, it is prefered that a welding use projecting portion is formed on a panel bonding surface of said frame, which faces to the periphery of the planar portion of said panel member.

In this case, basically the same effects as in the above mentioned aspects of the present invention can be achieved. Moreover, the welding use resin layer formed on the planar portion periphery of each panel member and the welding use projecting portion provided on the frame are melted together, so that the panel member is welded to the frame. Therefore, a sufficient fixing force capable of enduring a long-term use can be stably obtained.

Furthermore, in the above mentioned aspects of the present invention, it is prefered that said panel member is integrally fixed on the upper surface or the lower surface of said resin frame in forming said frame.

In this case, basically the same effects as in the above mentioned aspects of the present invention can be achieved. Moreover, one panel member and the frame are integrated with each other by, for example, the so-called panel-frame integrating method in forming the frame made of resin, thereby improving the rigidity of the frame and eliminating the concern about the occurrence of deformation of the frame or the like due to the pressure force applied when welding the other metal panel.

Furthermore, in a third aspect of the present invention, there is provided a method for manufacturing an IC card in which a pair of upper and lower panel members covering card planar portions are respectively fixed to an upper and a lower surfaces of a resin frame which supports a peripheral portion of an electric circuit board and a connector attached to an end portion of the electric circuit board, comprising the steps of: forming a welding use projecting portion on a frame surface which faces to the panel member; forming a welding use resin layer on the panel member at least in a portion thereof which corresponds to said welding use projecting portion; combining said welding use resin layer with said welding use projecting portion so that they abut against each other; and melting the abutment portion in a pressurized state, thereby fixing said panel member to an upper surface or a lower surface of said frame.

According to the third aspect of the present invention, the welding use resin layer formed on the planar portion periphery of each panel member and the welding use projecting portion provided on the frame are melted together, so that the panel member is welded to the frame. Therefore, a sufficient fixing force capable of enduring a long-term use can be stably obtained.

Furthermore, in the above mentioned aspect of the present invention, it is prefered that the pressurizing process for pressurizing said panel member against the frame is executed while applying a supersonic wave or vibration to the panel member.

In this case, basically the same effects as in the above mentioned aspect of the present invention can be achieved. Moreover, the pressurizing process for pressurizing the panel members from above and below is performed with a supersonic wave or vibration applied to the panels. This arrangement can obviate the need for holding the panel member and the frame in a state in which they are combined with each other and allow the welding use resin layer formed on the panel member or the welding use projecting portion provided on the frame to be melted and softened in a very short time in comparison with the case where they are pressurized while being held with heat applied by, for example, a thermostatic oven, thereby allowing the productivity of the card assembling process to be improved.

DETAILED DESCRIPTION OF THE PREFERRED EMBODIMENTS

First Embodiment

Figure 1:
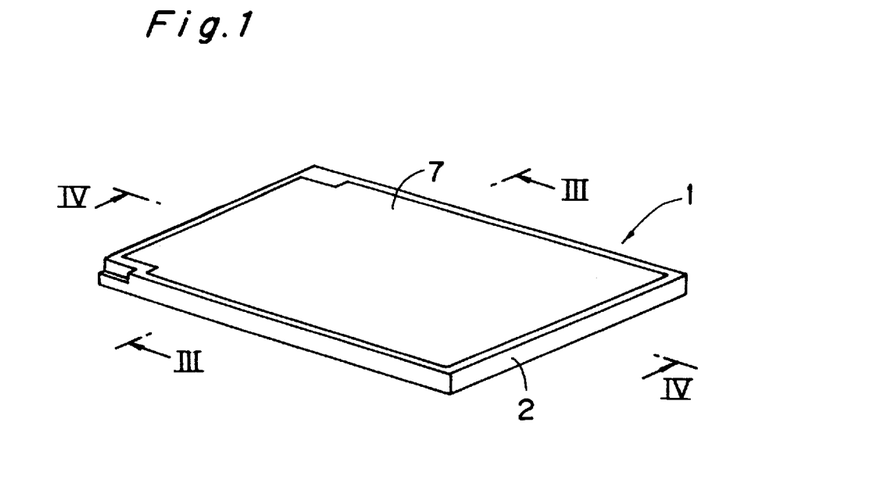
FIG. 1 is an overall perspective view of an IC card according to a first embodiment of the present invention.
Figure 2:
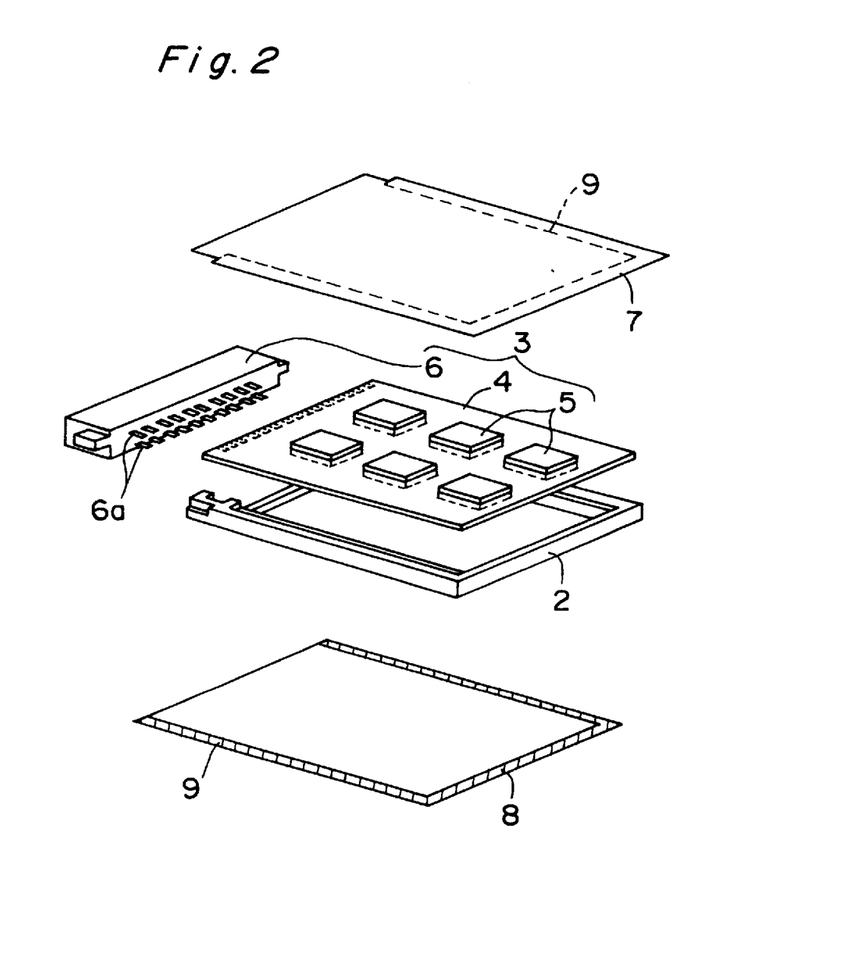
FIG. 2 is an exploded perspective view of the IC card of the first embodiment.

Hereinafter, some embodiments of the present invention will be described in detail with reference to the accompanying drawings. FIG. 1 is an overall perspective view of an IC card 1 according to a first embodiment of the present invention, while FIG. 2 is an exploded perspective view of this IC card 1.

As shown in these figures, the IC card 1 is provided with a frame 2 which is made of resin and constitutes the outer configuration of a main body, an electric circuit board 4 incorporated with specified electronic components 5 and the like, a connector 6 attached to one end portion of the electric circuit board 4 and a pair of metal panels 7 and 8 covering the upper surface side and the lower surface side of the IC card 1 including the electric circuit board 4 and the connector 6.

The connector 6 is to be electrically connected to a equipment (such as a personal computer) for which the present IC card 1 is used, for sending and receiving signals, and it is placed at one side surface (the front side surface) in the longitudinal direction of the IC card 1. The electronic components 5 and the connector 6 are electrically and mechanically connected to the electric circuit board 4 by a method such as soldering, and these components thereby constitute a module 3 which serves as a sort of unit. The electric circuit board 4 and the connector 6 are connected to each other via a large number of metal conductors 6a. The frame 2 is constructed as one piece by a resin molding method with, for example, polybutylene terephthalate resin.

The IC card 1 is assembled by incorporating the module 3 into the frame 2 so that the frame 2 supports the peripheral portion of the electric circuit board 4 and the connector 6, and then by fixing metal panels 7 and 8 to the upper surface and the lower surface of the frame 2, respectively.

Figure 3:
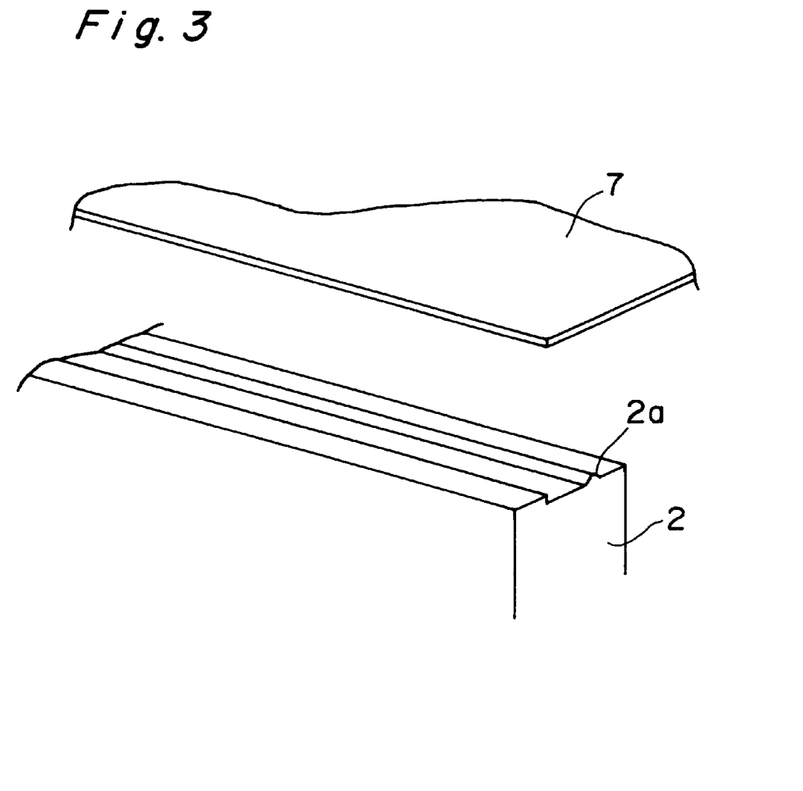
FIG. 3 is an enlarged perspective view showing side portions of an upper surface portion of a frame and an upper metal panel of the IC card of the first embodiment.
Figure 4:
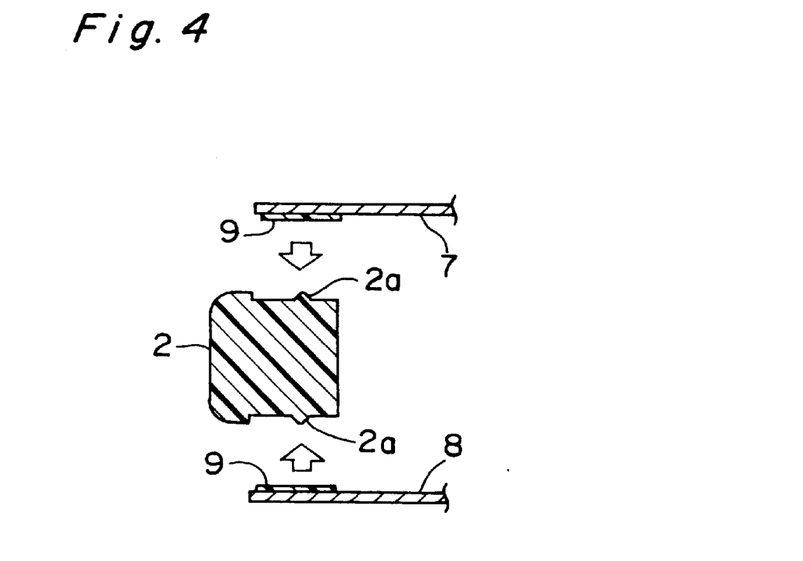
FIG. 4 is an explanatory view of a longitudinal section showing a state before panels are combined with upper and lower surface portions of the frame of the IC card of the first embodiment.

A structure for fixing the metal panels 7 and 8 to the frame 2 will be described below. FIG. 3 and FIG. 4 are respectively the enlarged perspective view and a sectional view of side portions of the frame 2 and the metal panels 7 and 8 before the panel 7 is fastened to the frame 2. As illustrated in detail in these figures, according to the present embodiment, a welding use projecting portion 2a extending in the lengthwise direction of the frame 2 is provided on the upper surface and the lower surface of the frame 2, which faces to the planar portion peripheries of the metal panels 7 and 8. The welding use projecting portion 2a has its sectional area set to a specified size (for example, 0.5 mm in height) and a specified shape (for example, a triangular shape).

On the other hand, the metal panels 7 and 8 are provided with a welding use resin layer 9 (see FIG. 4) in a portion corresponding to the welding use projecting portion 2a provided on the frame 2. This welding use resin layer 9 is formed so as to have a thickness of, for example, 20 to 30 $\mu$m by screen-printing epoxy-based resin or polyethylene-based resin on the planar portion peripheries of the metal panels 7 and 8 except for a portion to which the connector 6 is attached. Although the resin layer is screen-printed on the metal panels 7 and 8 in the present embodiment, the present invention is not limited to this, and dip adhering may be employed for the purpose of forming thicker resin layers.

Figure 7:
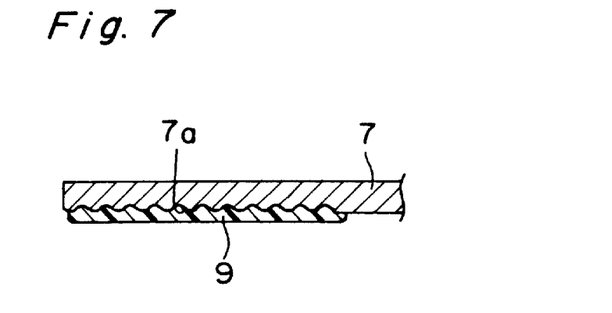
FIG. 7 is an explanatory view of a section showing a modification example of a panel on which an adhesive resin layer is formed.

Furthermore, as shown in FIG. 7, the planar portion periphery of the metal panel 7 on which the welding use resin layer 9 is formed may be provided with a surface roughness of 10 to 20 $\mu$m in terms of maximum height roughness. By providing such a surface roughness, the welding use resin layer 9 to be formed on the panel 7 is allowed to have an improved adhesion to the panel 7. In regard to the metal panel 8 on the lower surface side, the same effect can be obtained by providing the aforementioned surface roughness. It is to be noted that such a surface roughness can be easily provided by sandblasting of a specified grain size.

Then, by combining the frame 2 with the metal panels 7 and 8 so that the welding use resin layer 9 formed on the metal panels 7, 8 and the welding use projecting portion 2a provided on the frame 2 abut against each other and pressurizing the metal panels 7, 8 from above and below, the metal panels 7 and 8 are respectively fixed to the upper surface side and the lower surfaces of the frame 2.

Figure 5:
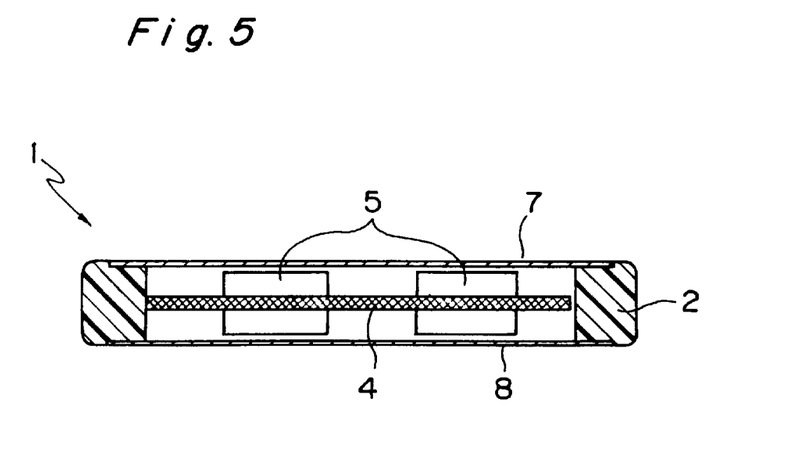
FIG. 5 is an explanatory view of a longitudinal section taken along the line III—III in FIG. 1.
Figure 6:
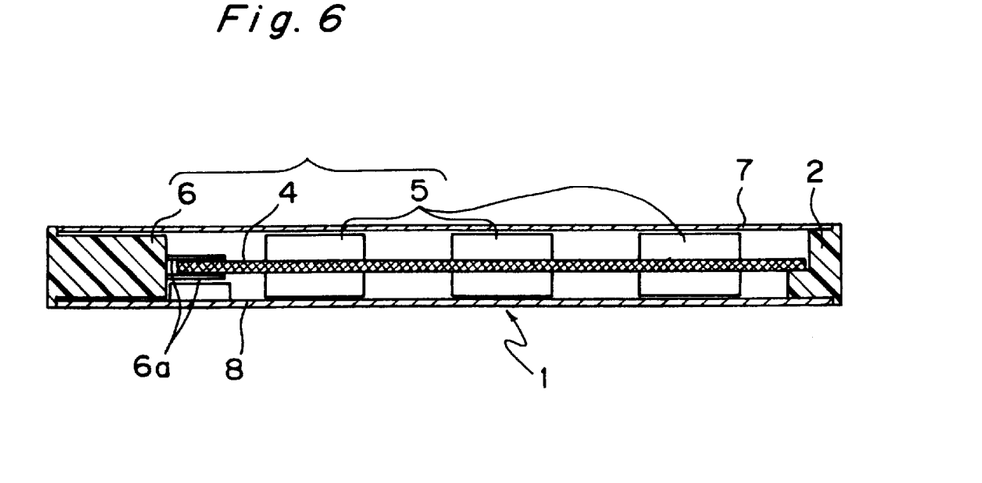
FIG. 6 is an explanatory view of a longitudinal section taken along the line IV—IV in FIG. 1.

That is, by applying a supersonic wave while pressurizing the metal panels 7 and 8 from above and below, the projecting portion 2a and the resin layer 9 which abut against each other are softened and melted, so that the projecting portion 2a is deformed to spread in correspondence with the resin layer 9, so that the metal panels 7 and 8 are bonded to the frame 2 as shown in FIG. 5 and FIG. 6. Although the supersonic wave is applied to the aforementioned abutment portion in the welding process in the present embodiment, the present invention is not limited to this, and it is possible to melt the welding use projecting portion 2a with the resin layer 9 by applying to the abutment portion a vibration at a frequency lower than that of the supersonic wave.

As described above, according to the present first embodiment, as a consequence of the melting of the welding use resin layer 9 formed on the planar portion peripheries with the welding use projecting portion 2a provided on the frame 2, the metal panels 7 and 8 are welded to the frame 2. Therefore, in comparison with the case of the second and third prior arts where they are fixed merely by the engagement, a sufficient fixing power capable of enduring a long-term use can be stably obtained.

Furthermore, although not specifically shown, on the portions (front side) corresponding to the connector 6 of the metal panels 7 and 8 welding use resin layer nay be formed. In this case, by making the resin layer corresponding to the connector 6 abut against the connector 6 and applying a supersonic wave to the metal panels 7 and 8 while pressurizing them from above and below, the welding use resin layer formed in correspondence with the connector 6 is melted, so that the metal panels 7 and 8 and the connector 6 are welded together. This arrangement can obviate the need for an adhesive sheet as used in, for example, the third and fourth prior arts, thereby allowing the components to be handled in the assembling process to be reduced in number.

Furthermore, in this case, the welding is achieved in the entire bonding area, and therefore, a greater welding strength can be provided between the metal panels 7, 8 and the frame 2, in comparison with the case of the first prior art where the welding is achieved only at the bent portions formed at the peripheral edge portions of the metal panels.

Furthermore, either one of the metal panels 7, 8 and the frame 2 may be integrated with the frame 2 by, for example, the so-called panel-frame integrating method in forming the resin frame 2. By this method, the frame 2 which is preparatorily integrated with one metal panel has a greater rigidity, so that the concern about the occurrence of deformation of the frame 2 or the like due to a pressure force applied in welding the other metal panel can be eliminated.

Second Embodiment

An IC card 21 according to a second embodiment of the present invention will be described below with reference to FIG. 8 through FIG. 13. In the description below, the same components as those of the aforementioned first embodiment are denoted by the same reference numerals, and basically no further description is provided for them.

Figure 8:
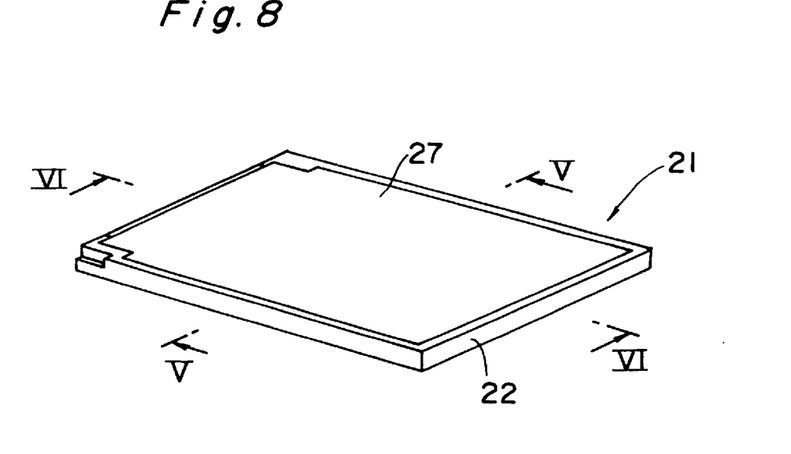
FIG. 8 is an overall perspective view of an IC card according to a second embodiment of the present invention.
Figure 9:
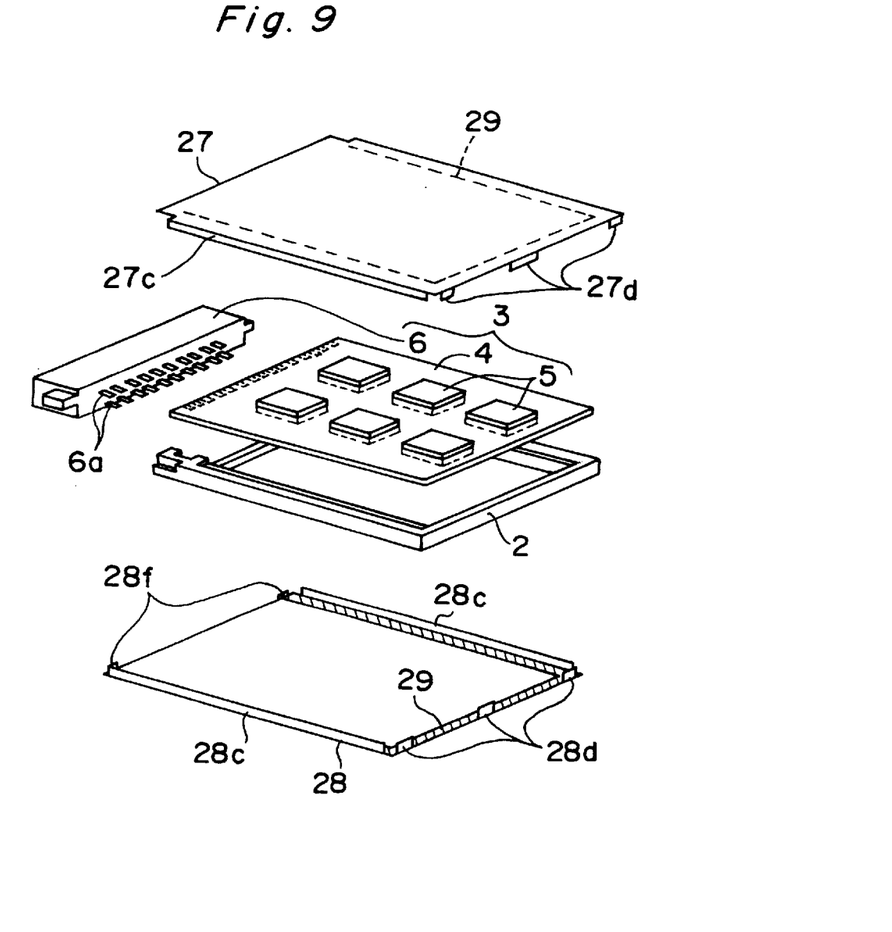
FIG. 9 is an exploded perspective view of the IC card of the second embodiment.

This IC card 21 is assembled by incorporating the module 3 into a frame 22 so that the frame 22 supports the peripheral portion of the electric circuit board 4 and the connector 6 and then by fixing metal panels 27, 28 on the upper surface and the lower surface of this frame 22, respectively.

In this second embodiment, side edge portions in the lengthwise direction of the metal panels 27, 28 are provided with bent portions 27c, 28c formed by bending a panel material at an angle of approximately 90 degrees into an L-figured section shape. These metal panels 27, 28 have their end portions on the front side and the rear side provided with a plurality of lugs (projections) 27d, 28d which project upwardly from the planar portions of the panels by bending a panel material at an angle of approximately 90 degrees similar to the bent portions 27c, 28c.

The metal panels 27 and 28 are provided with a welding use resin layer 29 inwardly of the bent portions 27c and 28c and the lugs 27d and 28d. This welding use resin layer 29 is formed so as to have a thickness of, for example, 20 to 30 µm by screen-printing an epoxy-based or polyethylene-based resin on the planar portion peripheries of the metal panels 27, 28 except for the portion to which the connector 6 is attached.

Figure 12:
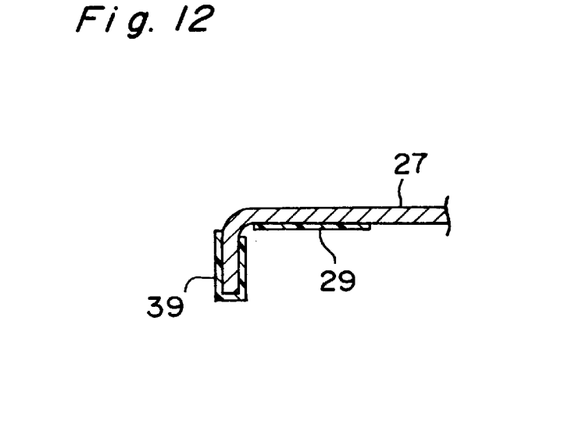
FIG. 12 is an explanatory view of a section showing a state in which a resin layer is formed at a bent portion of the panel of the IC card of the second embodiment.

As clearly shown in FIG. 12, this second embodiment has a welding use resin layer 39 formed on the bent portions 27c and 28c of the metal panels 27 and 28.

Although the resin layer is screen-printed on the metal panels 27 and 28 in the present embodiment, the present invention is not limited to this, and dip adhering may be employed for the purpose of forming a thicker resin layer. Furthermore, although not specifically shown, the planar portion peripheries and the bent portions 27c, 28c of the metal panels 27, 28 on which the welding use resin layers 29, 39 are formed may be provided with a surface roughness of 10 to 20 µm in terms of maximum height roughness. By providing such a surface roughness, the welding use resin layers 29 and 39 to be formed on the metal panels 27 and 28 is allowed to have an improved adhesion to the metal panels 27 and 28. It is to be noted that such a surface roughness can be easily provided by sandblasting of a specified grain size.

Figure 10:
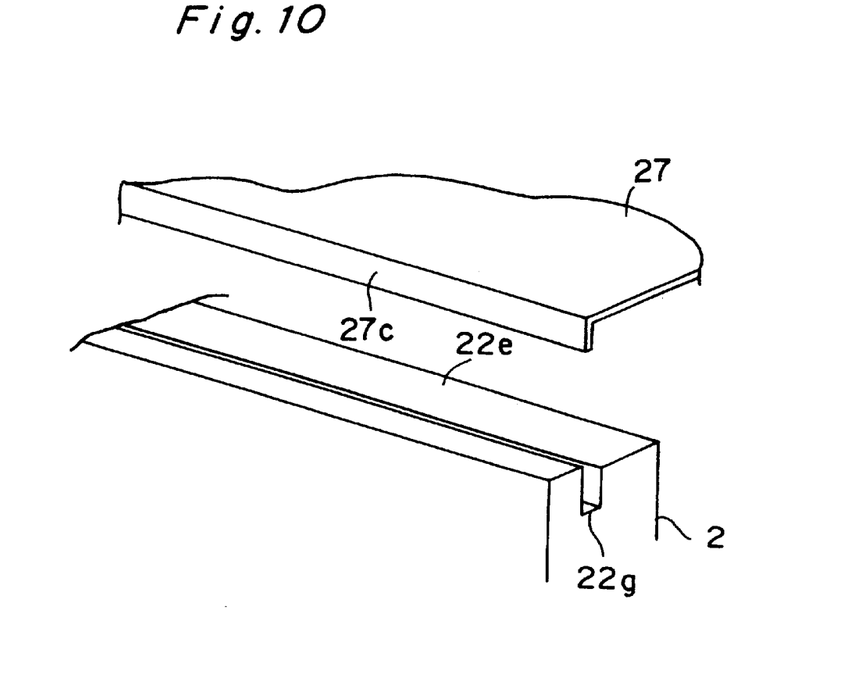
FIG. 10 is an enlarged perspective view showing side portions of an upper surface portion of a frame and an upper panel of the IC card of the second embodiment.
Figure 11:
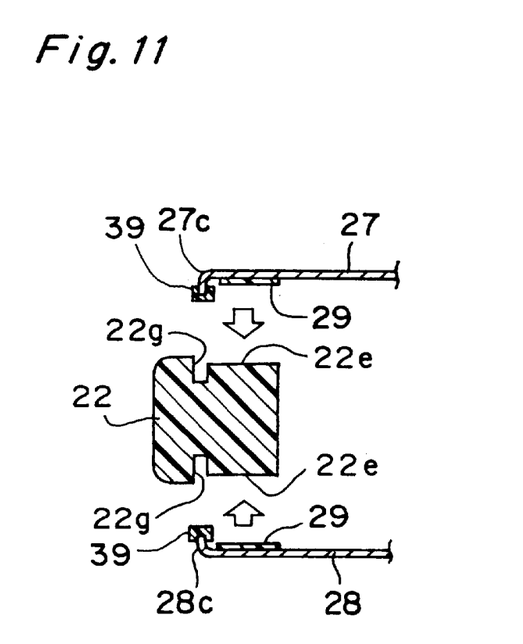
FIG. 11 is an explanatory view of a longitudinal section showing a state before panels are combined with the upper and lower surface portions of the frame of the IC card of the second embodiment.

On the other hand, as shown in FIG. 10 and FIG. 11, the frame 22 is provided with groove portions 22g which receive therein the bent portions 27c, 28c of the metal panels 27, 28 and are formed in the lengthwise direction on the upper and the lower surfaces. Inwardly of the groove portions 22g are provided metal panel bonding surfaces 22e corresponding to the welding use resin layer 29 formed on the planar portion peripheries of the metal panels 27 and 28.

Further, the frame 22 is provided with a plurality of slits 22s (see FIG. 14) into which the lugs 27d and 28d formed on the front side and the rear side of the metal panels 27 and 28 are to be press-fit. The length of each slit 22s is set shorter by a specified length (for example, 0.15 mm) than the length of the corresponding lugs 27d and 28d, and by forcibly press-fitting the lugs 27d and 28d into the corresponding slits 22s with an external force applied to them, the lugs 27d and 28d are press-fit and fixed to the frame 22b with a specified press-fitting force.

Then, by combining the frame 22 with the metal panels 27 and 28 so that the bent portions 27c and 28c formed at the side edge portions of the metal panels 27 and 28 are inserted into the groove portions 22g formed on the frame 22, and the welding use resin layer 29 and the metal panel bonding surfaces 22e of the frame 22 abut against each other, and pressurizing the metal panels 27 and 28 from above and below, the panels 27 and 28 are fixed to the upper surface and the lower surface of the frame 22. In this stage, the lugs 27d and 28d formed on the front side and the rear side of the metal panels 27 and 28 are press-fit into the slits 22s provided at the frame 22.

Figure 13:
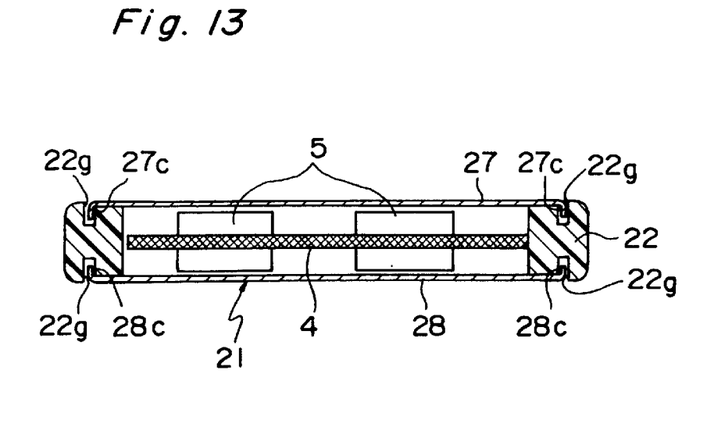
FIG. 13 is an explanatory view of a longitudinal section taken along the line V—V in FIG. 8.
Figure 14:
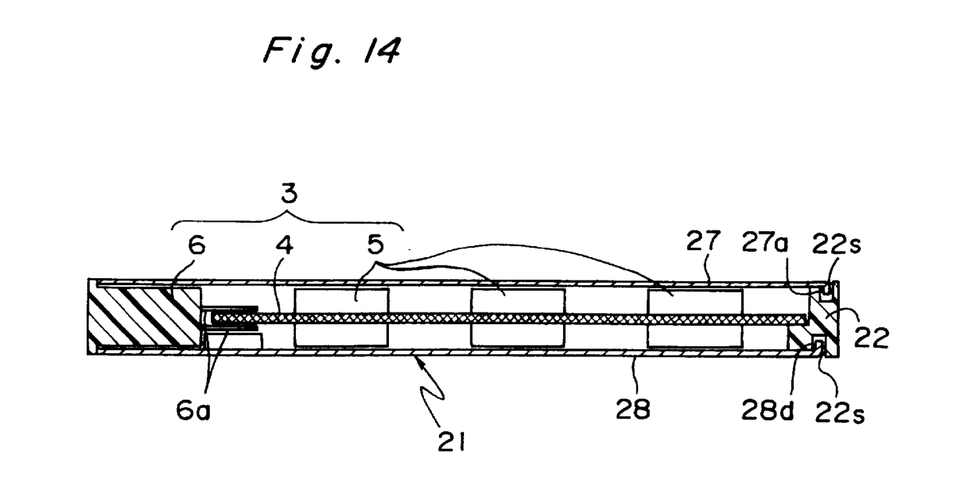
FIG. 14 is an explanatory view of a longitudinal section taken along the line VI—VI in FIG. 8.

That is, by applying a supersonic wave while pressurizing the metal panels 27, 28 from above and below, the resin layer 29 that is abutting against the metal panel bonding surface 22e and the welding use resin layer 39 on the bent portions 27c, 28c fit into the groove portions 22g are each softened and melted, so that the metal panels 27, 28 are bonded to the frame 22 as shown in FIG. 13 and FIG. 14. Although the supersonic wave is applied to the metal panels 27 and 28 in this welding process in the present embodiment, the present invention is not limited to this, and it is possible to melt the welding use resin layer 29, 39 by applying a vibration at a frequency lower than that of the supersonic wave.

Furthermore, in the present embodiment, the thickness of the bent portions 27c and 28c of the metal panels 27 and 28 including the welding use resin layer 39 formed on the surface is preferably set greater than the width of the groove portion 22g of the frame 22. By this setting, the reliability of the welded and fixed portions of the resin layer 39 on the bent portions 27c, 28c and the groove portion 22g can be improved.

As described above, according to the present second embodiment, as a consequence of the melting of the welding use resin layer 29 formed on the planar portion peripheries of the metal panels 27, 28 and the welding use resin layer 39 formed on the bent portions 27c, 28c, the metal panels 27, 28 are welded to the frame 22. Therefore, in comparison with the case of the second and third prior arts where they are fixed merely by the engagement, a sufficient fixing force capable of enduring a long-term use can be stably obtained.

Furthermore, although not specifically shown, the metal panels 27 and 28 may have their portions (front side) corresponding to the connector 6 provided with a welding use resin layer. In this case, by applying a supersonic wave to the metal panels 27 and 28 while pressurizing them from above and below with the resin layer corresponding to the connector 6 made to abut against the connector 6, the welding use resin layer is melted, so that the metal panels 27, 28 and the connector 6 are welded together. This arrangement can obviate the need for an adhesive sheet as used in, for example, the third and fourth prior arts, thereby allowing the components to be handled in the assembling process to be reduced in number.

Furthermore, in this case, the welding is achieved in the entire bonding area, and therefore, a greater welding strength can be provided between the metal panels 27, 28 and the frame 22 in comparison with the case of the first prior art where the welding is achieved only at the bent portions formed on the peripheral edge portions of the metal panels.

Figure 15:
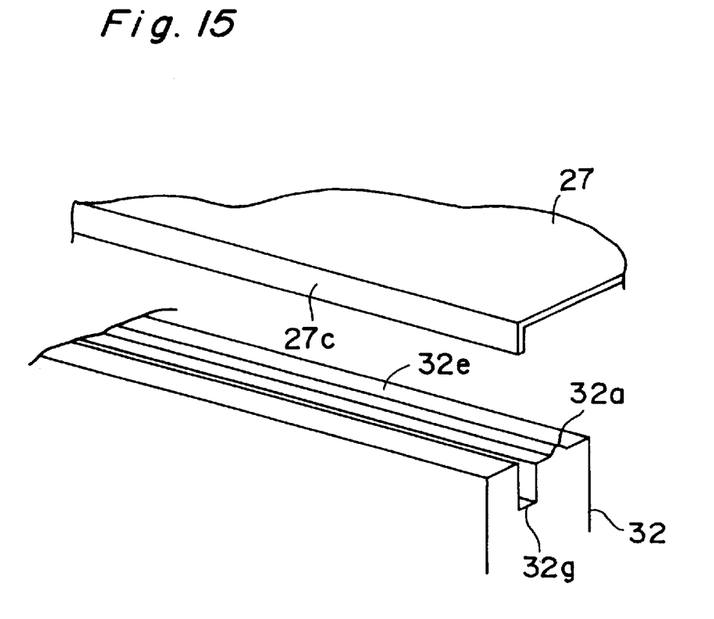
FIG. 15 is an enlarged perspective view showing side portions of an upper surface portion of a frame modification example and an upper panel of the IC card of the second embodiment.
Figure 16:
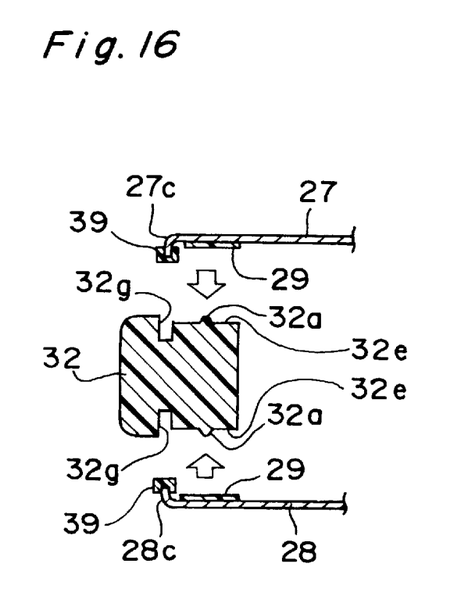
FIG. 16 is an explanatory view of a longitudinal section showing a state before panels are combined with the upper and lower surface portions of the frame modification example of the IC card of the second embodiment.

Although the frame 22 is provided with the flat metal panel bonding surfaces 22e in correspondence with the planar portion peripheries of the metal panels 27, 28 on which the welding use resin layer 29 is formed in the present embodiment, the present invention is not limited to this. As shown in FIGS. 15 and 16, it is acceptable to provide a welding use projecting portion 32a whose sectional area has a specified size (for example, 0.5 mm in height) and a shape (for example, a triangular shape) on the surface which belongs to the frame and face the resin layer 29 formed on the planar portion peripheries of the metal panels 27 and 28. In this case, by combining the frame 32 with the metal panels 27 and 28 so that the welding use resin layer 29 and the welding use projecting portion 32a provided on the frame 32 are made to abut against each other and applying a supersonic wave to them while pressurizing the metal panels 27 and 28 from above and below, the projecting portion 32a and the resin layer 29 which abut against each other are melted and softened, by which the projecting portion 32a is deformed to spread in correspondence with the resin layer 29, consequently bonding the metal panels 27 and 28 to the frame 32. As a result, a sufficient fixing power capable of enduring a long-term use can be stably obtained between the metal panels 27 and 28 and the frame 32.

Figure 17:
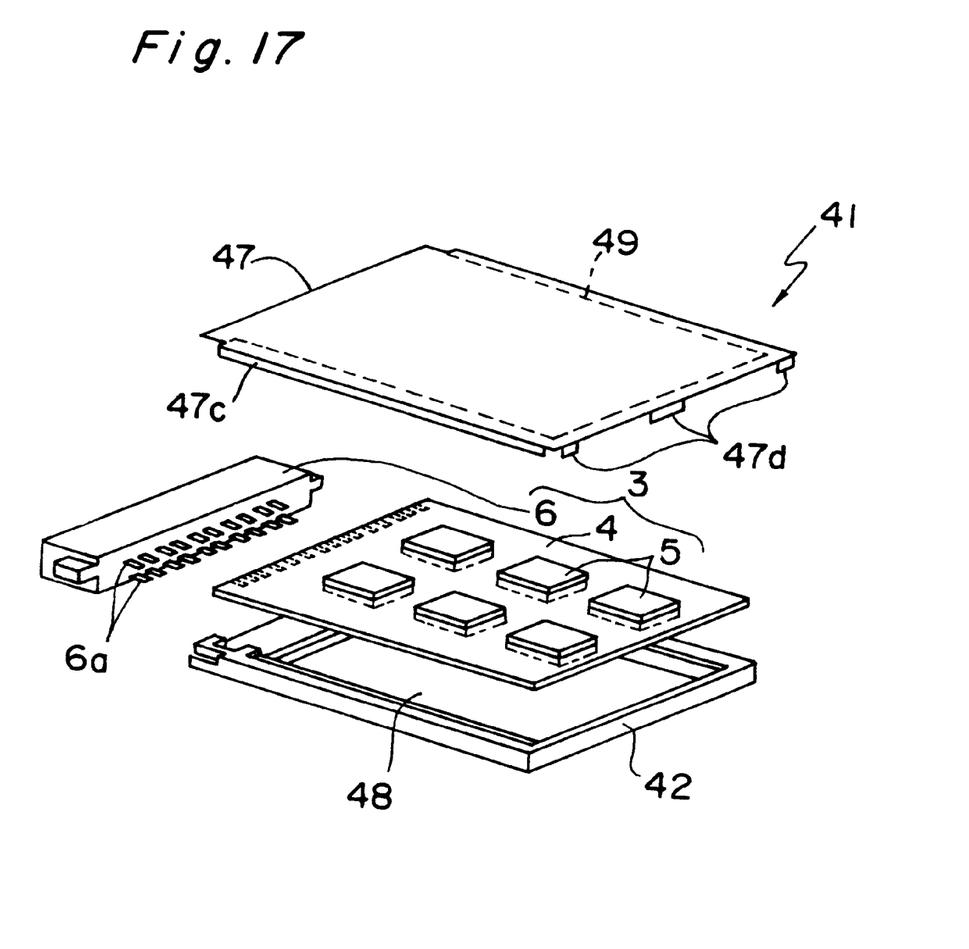
FIG. 17 is an exploded perspective view showing a modification example of the frame and the lower surface side panel of the IC card of the second embodiment of the present invention.

In FIG. 17 is shown an IC card 41 in which either one of a pair of upper and lower metal panels (a metal panel 48 on the lower surface side in this embodiment) is integrated with a frame 42 made of resin. The frame 42 and the metal panel 48 on the lower surface side are constructed so as to be integrated with each other in forming the resin frame 42 by, for example, the so-called panel-frame integrating method. This arrangement improves the rigidity of the frame 42 and is able to eliminate the concern about the occurrence of deformation or the like of the frame 42 due to the pressure force applied from a metal panel 47 on the upper surface in welding the metal panel 47.

It is to be noted that the present invention is not limited to the above-exemplified embodiments, and it is a matter of course that a variety of improvements or changes in design can be achieved within a scope thereof, not departing from the essence thereof.

What is claimed is:

1. An IC card in which a pair of upper and lower metal panel members covering card planar portions are respectively fixed to upper and lower surfaces of a resin frame which supports a peripheral portion of an electric circuit board and a connector attached to an end portion of the electric circuit board, wherein a welding use projecting portion is formed on a frame surface which faces the metal panel member, a thin film welding use resin layer is formed on the metal panel member at least in a portion thereof which corresponds to said welding use projecting portion, and said thin film welding use resin layer and said welding use projecting portion are melted in a pressurized state, thereby fixing said metal panel members to said frame.

2. An IC card as claimed in claim 1, wherein said metal panel members have a surface roughness defined by projections having a maximum height of 10–20 $\mu$m in a portion in which said thin film welding use resin layer is formed.

3. An IC card as claimed in claim 1, wherein the thin film welding use resin layer is formed on the metal panel member in a portion thereof which corresponds to at least a part of said connector.

4. An IC card as claimed in claim 1, wherein said thin film welding use resin layer and said welding use projecting portion which abut against each other are melted by applying a supersonic wave or vibration to said metal panel members.

5. An IC card as claimed in claim 1, wherein said metal panel members are integrally fixed on the upper surface or the lower surface of said resin frame in forming said frame.

6. An IC card in which a pair of upper and lower metal panel members covering card planar portions are respectively fixed to upper and lower surfaces of a resin frame which supports a peripheral portion of an electric circuit board and a connector attached to an end portion of the electric circuit board, wherein each said metal panel member has its peripheral edge portion provided with a bent portion which is extended along the peripheral edge portion by bending a panel material at a specified angle, a thin film welding use resin layer is formed on a surface of the bent portion and a periphery of a planar portion of each metal panel member, and said frame is provided with a groove portion for receiving therein said bent portion, whereby said thin film welding use resin layer is melted in a pressurized state while making said welding thin film use resin layer abut against the frame with said bent portion fitted into the groove portion, thereby fixing said metal panel members to said frame.

7. An IC card as claimed in claim 6, wherein a thickness of said bent portion including the thin film welding use resin layer formed on its surface is greater by a specified thickness than a width of the groove portion of said frame.

8. An IC card as claimed in claim 6, wherein the thin film welding use resin layer is formed on the metal panel members in a portion thereof which corresponds to at least a part of said connector.

9. An IC card as claimed in claim 6, wherein said metal panel members have a surface roughness defined by projections having a maximum height of 10–20 $\mu$m in a portion in which said thin film welding use resin layer is formed.

10. An IC card as claimed in claim 6, wherein said thin film welding use resin layer is melted by applying a supersonic wave or vibration to said metal panel members.

11. An IC card as claimed in claim 6, wherein a welding use projecting portion is formed on a panel bonding surface of said frame, which faces the periphery of the planar portion of said metal panel members.

12. An IC card as claimed in claim 6, wherein said metal panel members are integrally fixed on the upper surface or the lower surface of said resin frame in forming said frame.

* * * * *